(12) United States Patent  
Chen

(10) Patent No.: US 11,032,932 B1
(45) Date of Patent: Jun. 8, 2021

(54) MOUNT ASSEMBLY FOR EXPANSION CARD AND CIRCUIT ASSEMBLY

(71) Applicants: INVENTEC (PUDONG) TECHNOLOGY CORPORATION, Shanghai (CN); INVENTEC CORPORATION, Taipei (TW)

(72) Inventor: Shih-Wei Chen, Taipei (TW)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 0 days.

(21) Appl. No.: 16/714,314

(22) Filed: Dec. 13, 2019

(30) Foreign Application Priority Data

Nov. 18, 2019 (CN) .......................... 201911126663.7

(51) Int. Cl.
| | |
|---|---|
| *H05K 5/00* | (2006.01) |
| *H05K 7/14* | (2006.01) |
| *H05K 5/02* | (2006.01) |
| *H05K 7/18* | (2006.01) |
| *H05K 7/02* | (2006.01) |

(52) U.S. Cl.
CPC ......... *H05K 7/1489* (2013.01); *H05K 5/0286* (2013.01); *H05K 7/02* (2013.01); *H05K 7/183* (2013.01)

(58) Field of Classification Search
USPC ......................................................... 361/731
See application file for complete search history.

(56) References Cited

U.S. PATENT DOCUMENTS

| | | | | |
|---|---|---|---|---|
| 5,692,208 | A * | 11/1997 | Felcman | G06F 1/1616 |
| | | | | 312/9.29 |
| 5,889,649 | A * | 3/1999 | Nabetani | G06K 7/0082 |
| | | | | 361/679.32 |
| 6,850,409 | B1 * | 2/2005 | Triebes | G06F 1/184 |
| | | | | 211/41.11 |
| 6,947,290 | B2 * | 9/2005 | Hirata | G06K 7/0013 |
| | | | | 361/741 |
| 10,645,835 | B1 * | 5/2020 | Sauer | G06F 1/1684 |

\* cited by examiner

*Primary Examiner* — Hung S. Bui
(74) *Attorney, Agent, or Firm* — Maschoff Brennan

(57) ABSTRACT

A mount assembly configured to be cooperative with expansion card and socket of circuit board. Mount assembly includes first slide rail, second slide rail, first latch and first slidable stopper. First latch includes first cantilever and first protrusion. First cantilever includes first fixed end part and first free end part that are located opposite to each other. First fixed end part is fixed to sidewall part of first slide rail. First protrusion protrudes from first free end part and is located in groove of first slide rail. First protrusion is configured to be engaged with engagement hole of expansion card. First slidable stopper includes stopper body and handle portion. Stopper body is slidably disposed on sidewall part of first slide rail and movable between blocking position and releasing position. Handle portion protrudes from side of stopper body.

9 Claims, 11 Drawing Sheets

United States Patent

US 11,032,932 B1

MOUNT ASSEMBLY FOR EXPANSION CARD AND CIRCUIT ASSEMBLY

CROSS-REFERENCE TO RELATED APPLICATIONS

This non-provisional application claims priority under 35 U.S.C. § 119(a) on Patent Application No(s). 201911126663.7 filed in China, on Nov. 18, 2019, the entire contents of which are hereby incorporated by reference.

BACKGROUND OF THE INVENTION

Technical Field of the Invention

The invention relates to a mount assembly for expansion card and a circuit assembly, more particularly to a mount assembly and a circuit assembly that have slide rails.

Description of the Related Art

Open Compute Project (OCP) is an organization that shares designs of data center products and best practices among companies. Servers and expansion cards related to the open compute project have been widely used in various application. In general, expansion cards related to open compute project is inserted into a socket on a circuit board with the help of slide rails.

SUMMARY OF THE INVENTION

One embodiment of this invention provides a mount assembly configured to be cooperative with an expansion card and a socket of a circuit board. The mount assembly includes a first slide rail, a second slide rail, a first latch and a first slidable stopper. The first slide rail and the second slide rail are configured to be fixed to the circuit board. The first slide rail and the second slide rail each include a base part, a sidewall part, and a groove. The base part and the side wall part together form the groove therebetween. The expansion card is slidable in the grooves of the first slide rail and the second slide rail and is configured to be connected to the socket of the circuit board. The first latch includes a first cantilever and a first protrusion. The first cantilever includes a first fixed end part and a first free end part that are located opposite to each other. The first fixed end part is fixed to the sidewall part of the first slide rail. The first protrusion protrudes from the first free end part and is located in the groove of the first slide rail. The first protrusion is configured to be engaged with an engagement hole of the expansion card. The first slidable stopper includes a stopper body and a handle portion. The stopper body is slidably disposed on the sidewall part of the first slide rail and movable between a blocking position and a releasing position. The handle portion protrudes from a side of the stopper body. When the first slidable stopper is in the blocking position and the expansion card is inserted into the socket of the circuit board, the first slidable stopper blocks a side of the first free end part located away from the base part of the first slide rail and the first protrusion so as to prevent the first protrusion from disengaging from the engagement hole of the expansion card. When the first slidable stopper is in the releasing position and the expansion card is inserted into the socket of the circuit board, the first slidable stopper is located away from the first free end part to allow the first protrusion to disengage from the engagement hole of the expansion card.

Another embodiment of this invention provides a circuit assembly including a circuit board, an expansion card, a first slide rail, a second slide rail, a latch and a slidable stopper. The circuit board includes a plate and a socket disposed on the plate. The expansion card is inserted into the socket of the circuit board. The first slide rail and the second slide rail are fixed to the circuit board. The first slide rail and the second slide rail each include a base part, a sidewall part, and a groove. The base part and the side wall part together form the groove therebetween. The expansion card is slidable in the grooves of the first slide rail and the second slide rail and is configured to be connected to the socket of the circuit board. The latch includes a cantilever and a protrusion. The cantilever includes a fixed end part and a free end part that are located opposite to each other. The fixed end part is fixed to the sidewall part of the first slide rail. The protrusion protrudes from the free end part and is located in the groove of the first slide rail. The protrusion is configured to be engaged with an engagement hole of the expansion card. The slidable stopper includes a stopper body and a handle portion. The stopper body is slidably disposed on the sidewall part of the first slide rail and movable between a blocking position and a releasing position. The handle portion protrudes from a side of the stopper body. When the slidable stopper is in the blocking position and the expansion card is inserted in to the socket of the circuit board, the slidable stopper blocks on a side of the free end part located away from the base part of the first slide rail and the protrusion so as to prevent the protrusion from disengaging from the engagement hole of the expansion card. When the slidable stopper is in the releasing position and the expansion card is inserted into the socket of the circuit board, the slidable stopper is located away from the free end part to allow the protrusion able to disengage from the engagement hole of the expansion card.

BRIEF DESCRIPTION OF THE DRAWINGS

The present invention will become more fully understood from the detailed description given hereinbelow and the accompanying drawings which are given by way of illustration only and thus are not limitative of the present invention and wherein:

FIG. 2 is a perspective view of a first slide rail, a latch, and a slidable stopper in

FIG. 1;

DETAILED DESCRIPTION

Figure 1:
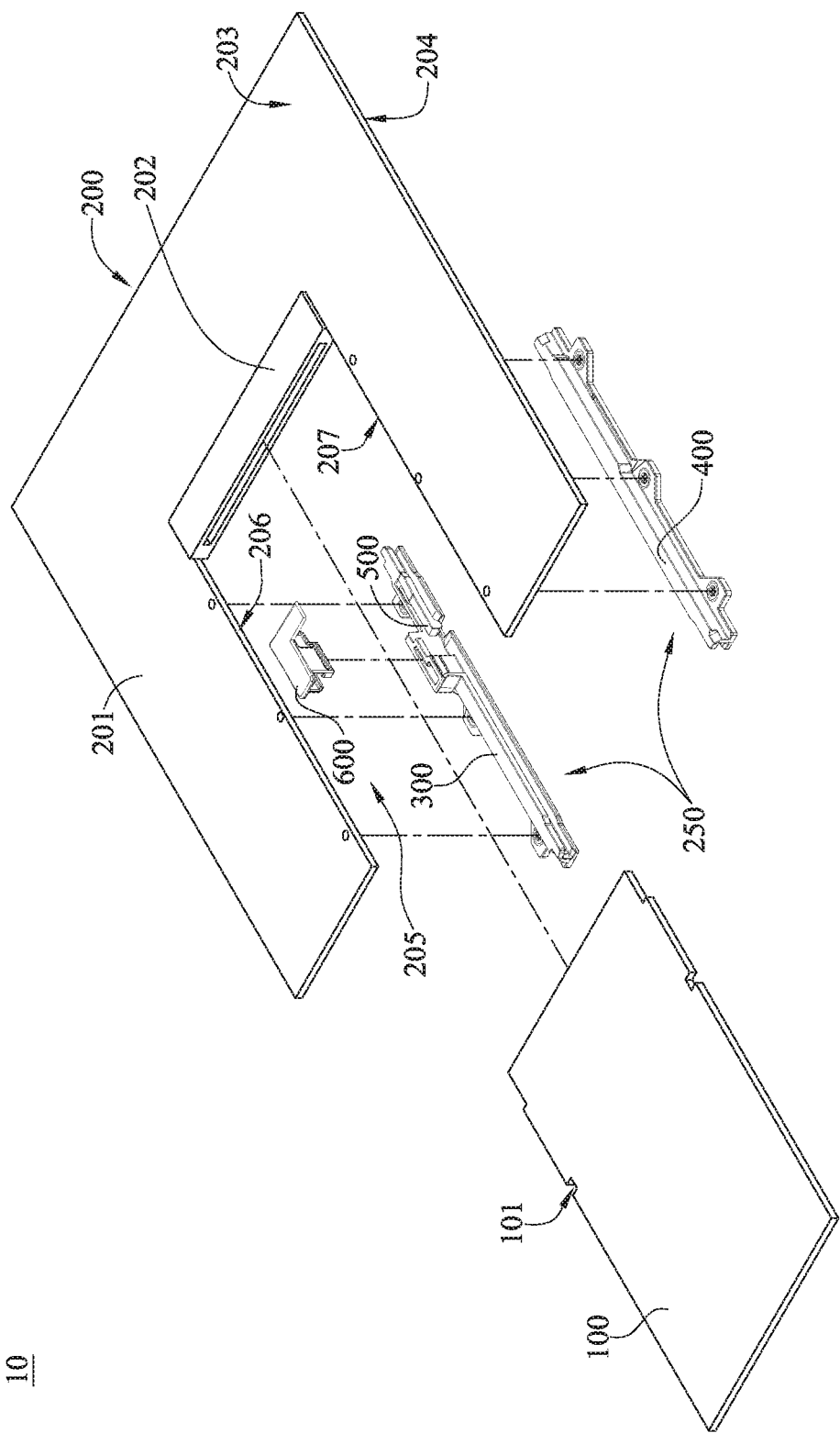
FIG. 1 is an exploded view of a circuit assembly according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
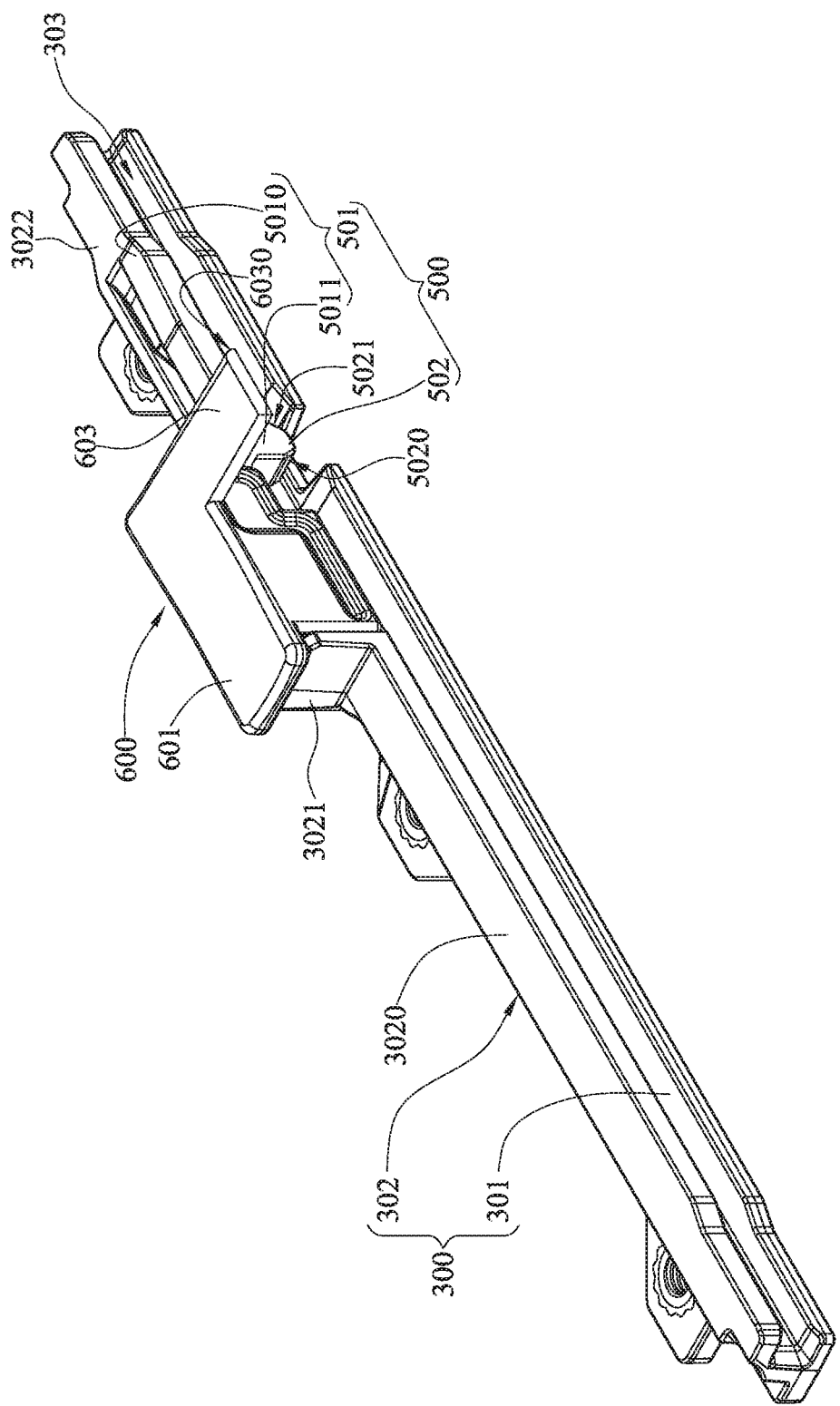
Figure 3:
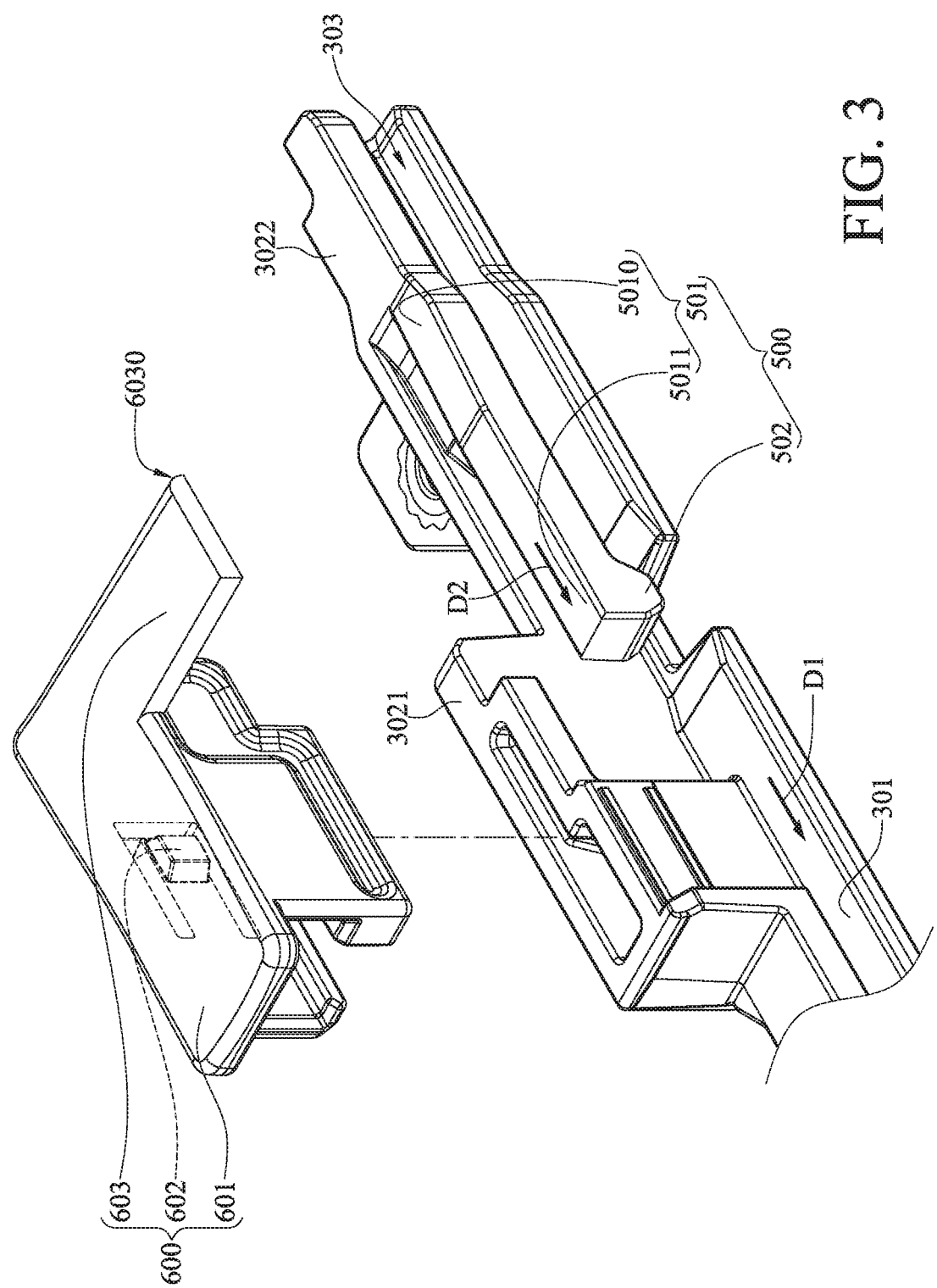
FIG. 3 is an exploded view of the first slide rail, the latch, and the slidable stopper in FIG. 2.
Figure 4:
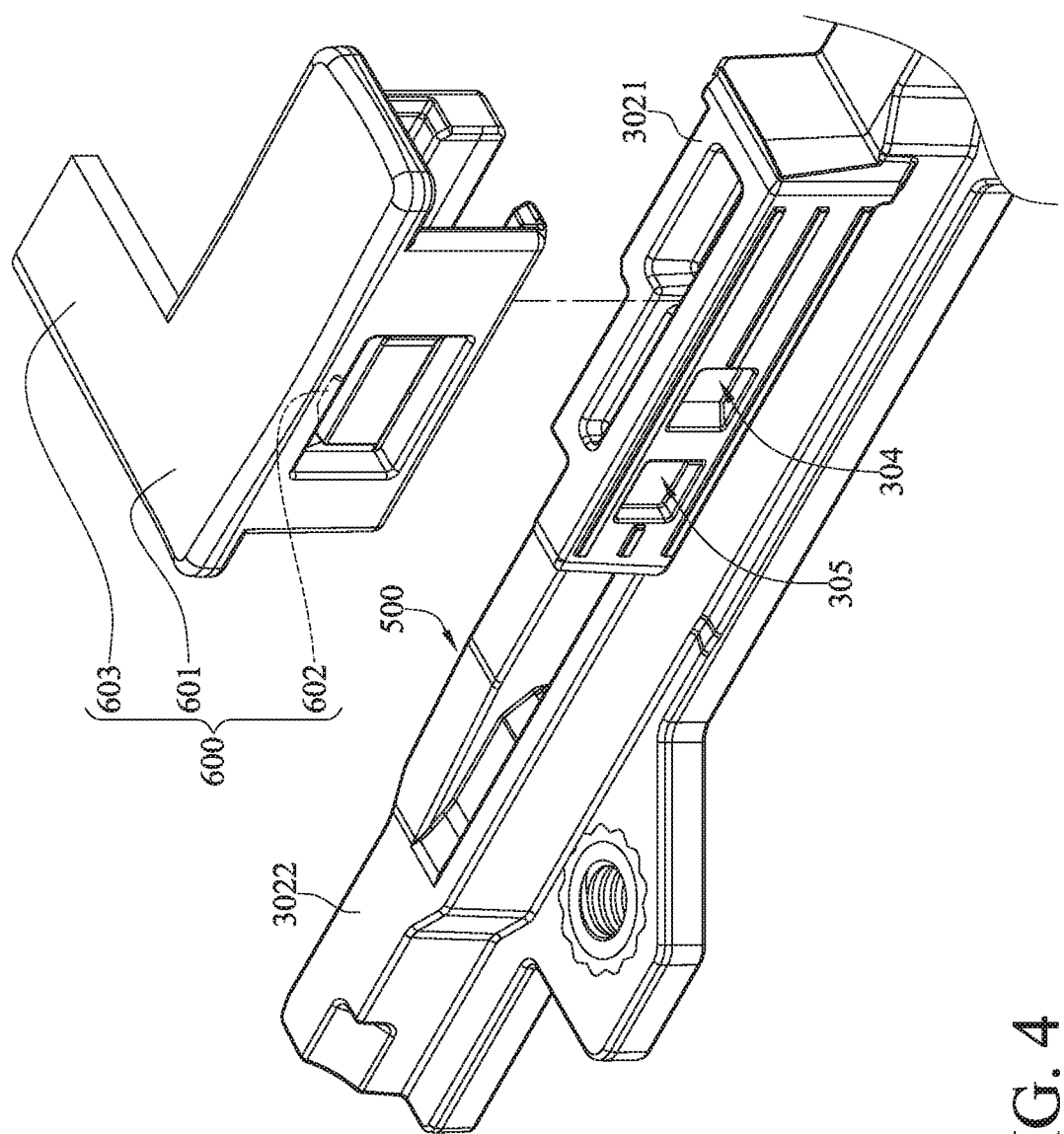
FIG. 4 is an exploded view of the first slide rail, the latch, and the slidable stopper in FIG. 2 taken from another viewing angle.

Please refer to FIG. 1 to FIG. 4, where FIG. 1 is an exploded view of a circuit assembly according to a first embodiment of the invention, FIG. 2 is a perspective view of a first slide rail, a latch and a slidable stopper in FIG. 1, FIG. 3 is an exploded view of the first slide rail, the latch and the slidable stopper in FIG. 2, and FIG. 4 is an exploded view of the first slide rail, the latch and the slidable stopper in FIG. 2 taken from another viewing angle.

As shown, this embodiment provides a circuit assembly 10 including an expansion card 100, a circuit board 200, and a mount assembly 250. The circuit board 200 includes a plate body 201 and a socket 202 disposed at the plate body 201. The plate body 201 of the circuit board 200 includes a top surface 203, a bottom surface 204, an opening 205, a first wall surface 206, and a second wall surface 207. The top surface 203 faces away from the bottom surface 204. The opening 205 penetrates through the top surface 203 and the bottom surface 204. The first wall surface 206, the second wall surface 207, and the socket 202 together form the opening 205. The first wall surface 206 and the second wall surface 207 are connected to the top surface 203 and the bottom surface 204. In addition, the first wall surface 206 faces towards the second wall surface 207. The socket 202 is located at one side of the opening 205. The expansion card 100 can be accommodated in the opening 205 and connected to the socket 202.

In this embodiment, the mount assembly 250 includes a first slide rail 300, a second slide rail 400, a latch 500, and a slidable stopper 600.

The first slide rail 300 and the second slide rail 400 are respectively fixed to the first wall surface 206 and the second wall surface 207 of the circuit board 200 for the slide movement of the expansion card 100 on the circuit board 200.

Note that the opening 205 on the circuit board 200 is optional. In other embodiments, the circuit board does not include the opening 205; in such a case, the socket, the first slide rail, and the second slide rail can be disposed on the top surface of the circuit board.

The first slide rail 300 and the second slide rail 400 are the same or similar in configuration, and thus only the first slide rail 300 will be described in detail in the following paragraphs to avoid repetition.

The first slide rail 300 includes a base part 301, a sidewall part 302, and a groove 303. The sidewall part 302 is connected to the base part 301. The sidewall part 302 and the base part 301 together form the groove 303 therebetween. The sidewall part 302 includes a first wall portion 3020, a second wall portion 3021, and a third wall portion 3022. The first wall portion 3020 is connected to the third wall portion 3022 via the second wall portion 3021. The second wall portion 3021 is located between the first wall portion 3020 and the third wall portion 3022. The third wall portion 3022 is located closer to the socket 202 than the first wall portion 3020. The groove 303 is configured for the slide movement of the expansion card 100, such that the expansion card 100 can be slid along the groove 303 to be connected to the socket 202 of the circuit board 200.

The latch 500 includes a cantilever 501 and a protrusion 502. The cantilever 501 includes a fixed end part 5010 and a free end part 5011 that are located opposite to each other. The fixed end part 5010 is fixed to the third wall portion 3022 of the sidewall part 302. In addition, as shown in FIG. 2, in this embodiment, an extension direction D1 of the groove 303 of the first slide rail 300 is substantially parallel to an extension direction D2 of the cantilever 501. That is, the extension direction D1 is parallel to the extension direction D2 or at a negligible angle to the extension direction D2, but the invention is not limited thereto. In other embodiments, the extension direction of the groove is at an acute angle to that of the cantilever.

The protrusion 502 protrudes from the free end part 5011 and is located in the groove 303 of the first slide rail 300. The protrusion 502 is configured to be engaged into an engagement hole 101 of the expansion card 100. The protrusion 502 includes a first guide surface 5020 and a second guide surface 5021 respectively located at opposite sides of the protrusion 502. The first guide surface 5020 and the second guide surface 5021 are configured to be engaged by the expansion card 100. As the expansion card 100 engages the first guide surface 5020 or the second guide surface 5021, the expansion card 100 forces the protrusion 502 to move away from the engagement hole 101 of the expansion card 100.

Note that, in some other embodiments, the protrusion does not include the first guide surface 5020 and the second guide surface 5021; in such a case, the removal of the protrusion from the engagement hole of the expansion card can be performed manually.

Furthermore, in this embodiment, the latch 500 and the first slide rail 300 are integrally formed into a single piece, but the disclosure is not limited thereto. In other embodiments, the latch and the first slide rail are two pieces assembled together.

The slidable stopper 600 includes a stopper body 601 and a positioning protrusion 602. The first slide rail 300 further includes a first positioning hole 304 and a second positioning hole 305. The first positioning hole 304 and the second positioning hole 305 are located on the sidewall part 302 of the first slide rail 300. The positioning protrusion 602 protrudes inwards from an inner surface of the stopper body 601. The stopper body 601 is slidably disposed on the second wall portion 3021 of the sidewall part 302 so that the slidable stopper 600 is movable between a blocking position and a releasing position. Additionally, the positioning protrusion 602 is selectively located in the first positioning hole 304 or the second positioning hole 305 so as to position the stopper body 601 in the releasing position or the blocking position.

However, the slidable stopper 600 is not limited to include the positioning protrusion 602 and the first slide rail 300 is not limited to include the first positioning hole 304 and the second positioning hole 305. In other embodiments, the slidable stopper does not include the positioning protrusion, the first slide rail does not include the first positioning hole and the second positioning hole, and the slidable stopper is positioned on the first slide rail by other suitable manner.

In addition, in this embodiment, the slidable stopper 600 further includes a handle portion 603. The handle portion 603 protrudes from a side of the stopper body 601. As shown, the handle portion 603 and the stopper body 601 substantially form a reversed L shape. Also, the handle portion 603 includes an arcuate side surface 6030 to facilitate the operation of the slidable stopper 600.

Note that the locations of the fixed end part 5010 of the cantilever 501 and the stopper body 601 are not restricted and can be modified as desired. In other embodiments, the fixed end part of the cantilever is fixed to the second wall portion, and the stopper body is slidably disposed on the third wall portion that is located closer to the socket.

For the purpose of description, only the cooperation of the first slide rail 300, the latch 500, and the slidable stopper 600 will be described below to explain the installation or removal of the expansion card 100 from the socket 202 of the circuit board 200.

Figure 5:
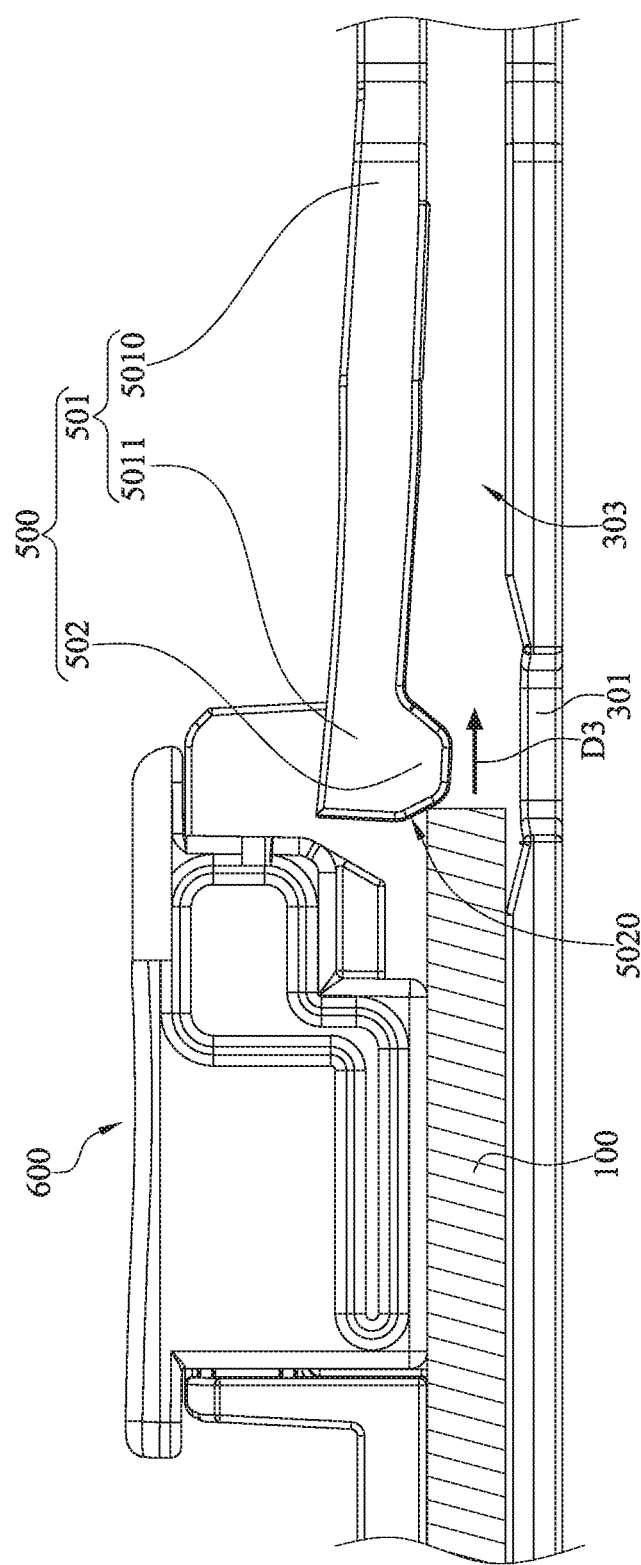
FIG. 5 depicts that an expansion card engages a first guide surface of a protrusion and the slidable stopper is in a releasing position.

Please refer to FIG. 5. FIG. 5 is a side view showing that an expansion card pushes a first guide surface of a protrusion and the slidable stopper is located at a releasing position.

As shown in FIG. 5, the slidable stopper 600 is in the releasing position and the expansion card 100 is sliding into the groove 303 of the first slide rail 300 along an insertion direction D3. During this process, the expansion card 100 engages the first guide surface 5020 of the protrusion 502 of the latch 500 so that the expansion card 100 can force the protrusion 502 protruding from the free end part 5011 of the cantilever 501 to move away from the base part 301. That is, the insertion of the expansion card 100 can move the protrusion 502 out of its normal position so as to force the cantilever 501 to deform. The movement of the latch 500 enables the insertion of the expansion card 100 into the groove 303 along the insertion direction D3.

Figure 6:
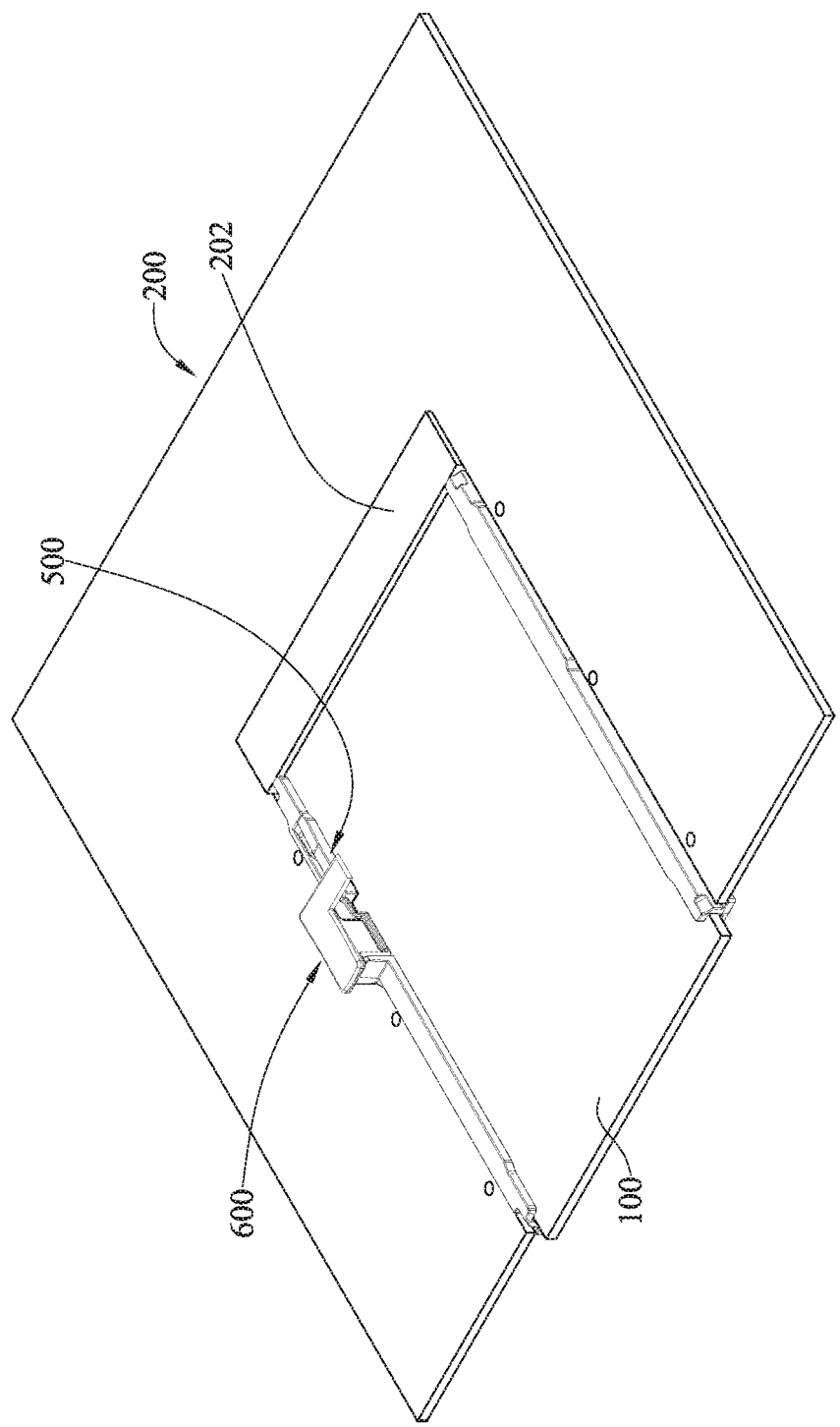
FIG. 6 depicts that the expansion card is inserted into a socket of a circuit board.
Figure 7:
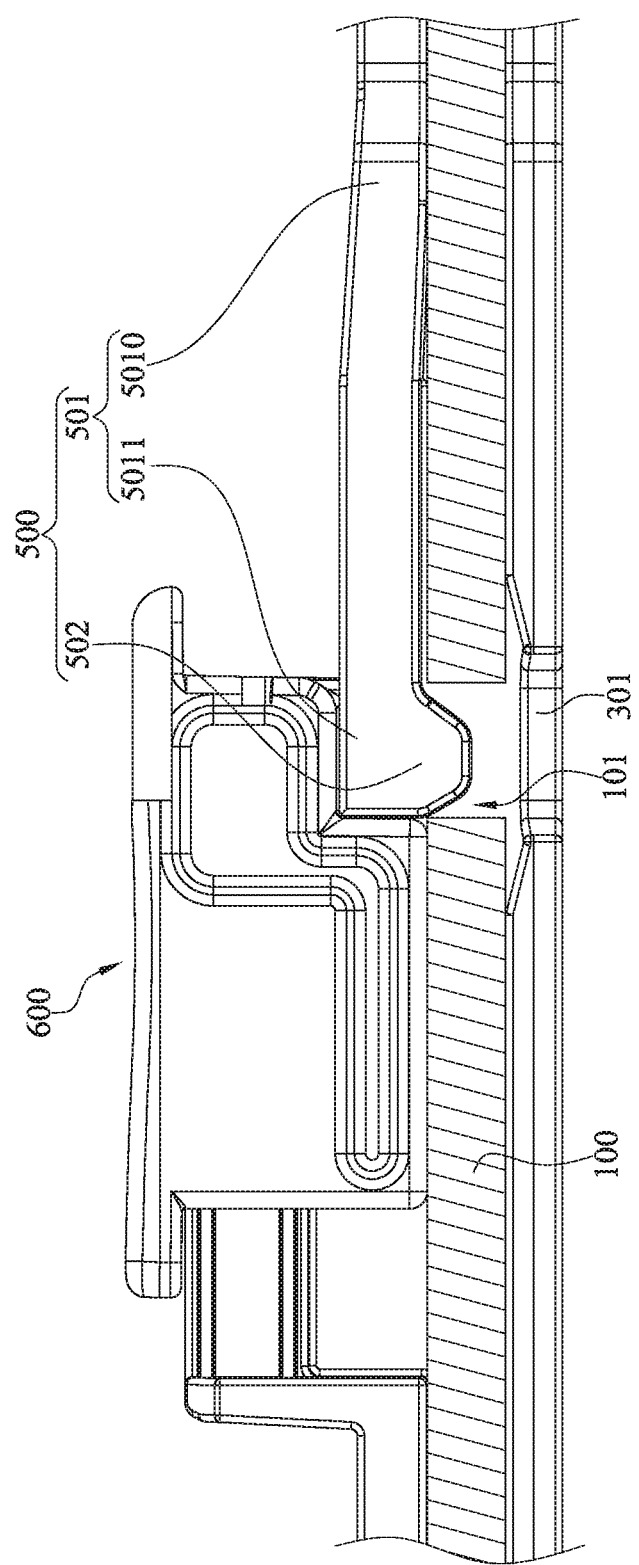
FIG. 7 depicts that the protrusion is engaged in an engagement hole of the expansion card and the slidable stopper is in a blocking position.

Next, please refer to FIG. 6 and FIG. 7, where FIG. 6 is a perspective view showing that the expansion card is inserted into a socket of a circuit board, and FIG. 7 is a side view showing that the protrusion is engaged in an engagement hole of the expansion card and the slidable stopper is located at a blocking position.

As shown in FIG. 6 and FIG. 7, as the expansion card 100 reaches the predetermined position of being able to be inserted into the socket 202 of the circuit board 200, the protrusion 502 does not interfere with the expansion card 100. At this moment, the cantilever 501 can spring to its normal position so as to restore the protrusion 502 and making it engage into the engagement hole 101 of the expansion card 100. This secures the current position of the expansion card 100. Also, the slidable stopper 600 can be moved to the blocking position to block a side of the free end part 5011 that is located away from the base part 301 of the first slide rail 300, and thus the protrusion 502 is prevented from moving away from the expansion card 100, thereby securing the engagement between the protrusion 502 and the engagement hole 101.

Figure 8:
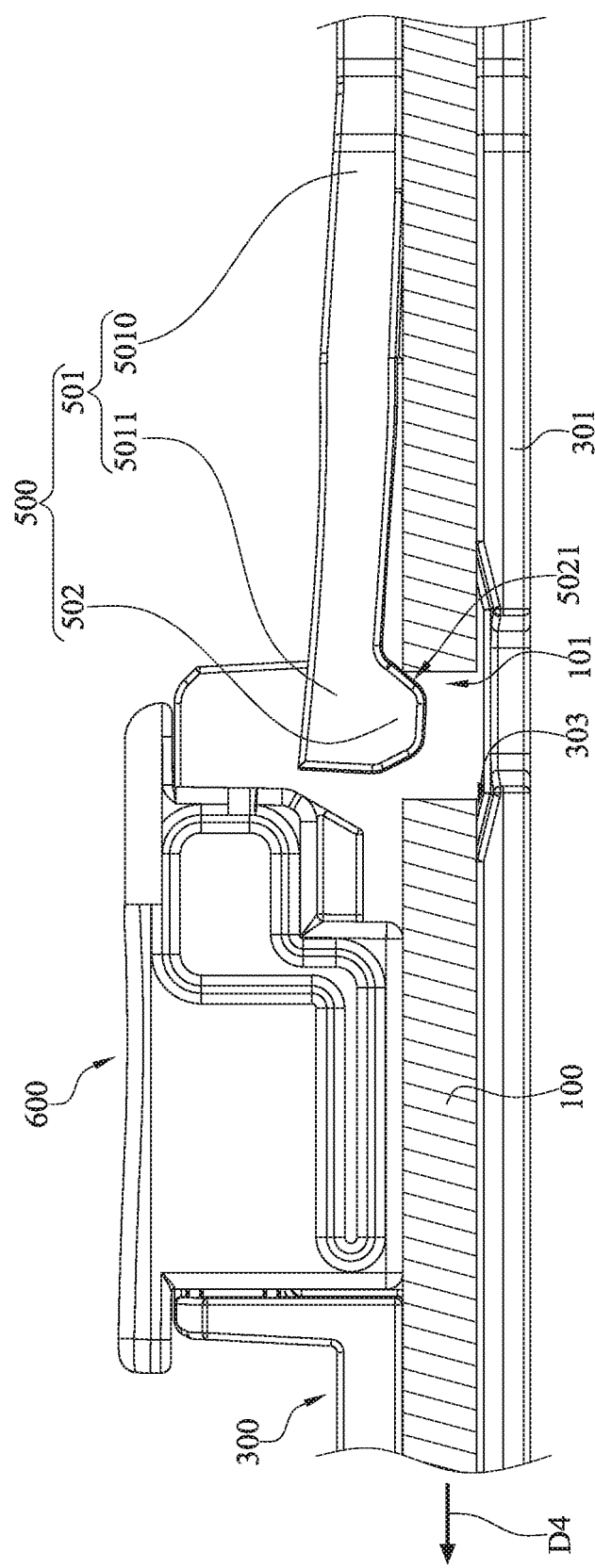
FIG. 8 depicts that the expansion card engages a second guide surface of the protrusion and the slidable stopper is in the releasing position.

Then, please refer to FIG. 8 to explain the removal of the expansion card 100, where FIG. 8 is a side view showing that the expansion card pushes a second guide surface of the protrusion and the slidable stopper is located at the releasing position.

As shown, the first step is to return the slidable stopper 600 to the releasing position, by doing so, the free end part 5011 of the cantilever 501 is not blocked by the slidable stopper 600 and is allowed to be moved away from the expansion card 100. Therefore, the second step is to draw the expansion card 100 in a detaching direction D4 opposite to the insertion direction D3. During the movement of the expansion card 100 in the detaching direction D4, the expansion card 100 engages the second guide surface 5021 of the protrusion 502 so that the expansion card 100 can force the protrusion 502 to disengage from the engagement hole 101 of the expansion card 100. That is, the removal of the expansion card 100 also can move the protrusion 502 out of its normal position so as to force the cantilever 501 to deform. And the movement of the latch 500 enables the removal of the expansion card 100 from the groove 303 along the detaching direction D4.

Figure 9:
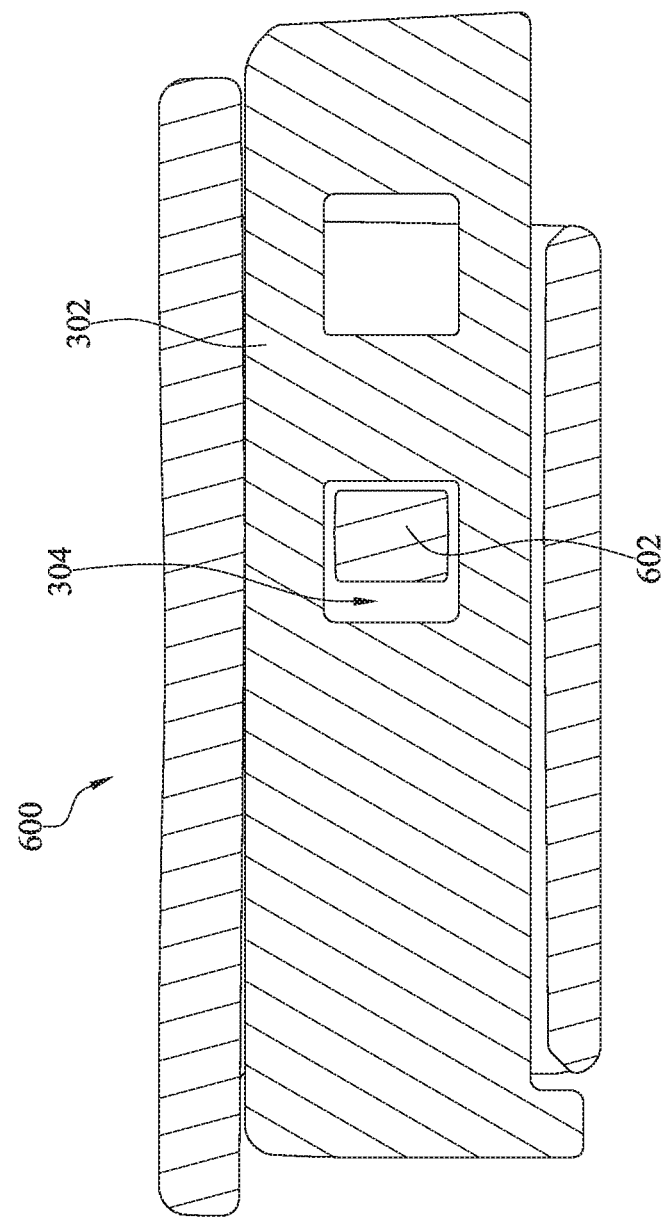
FIG. 9 depicts that a positioning protrusion of the slidable stopper is located in a first positioning hole of a sidewall part.
Figure 10:
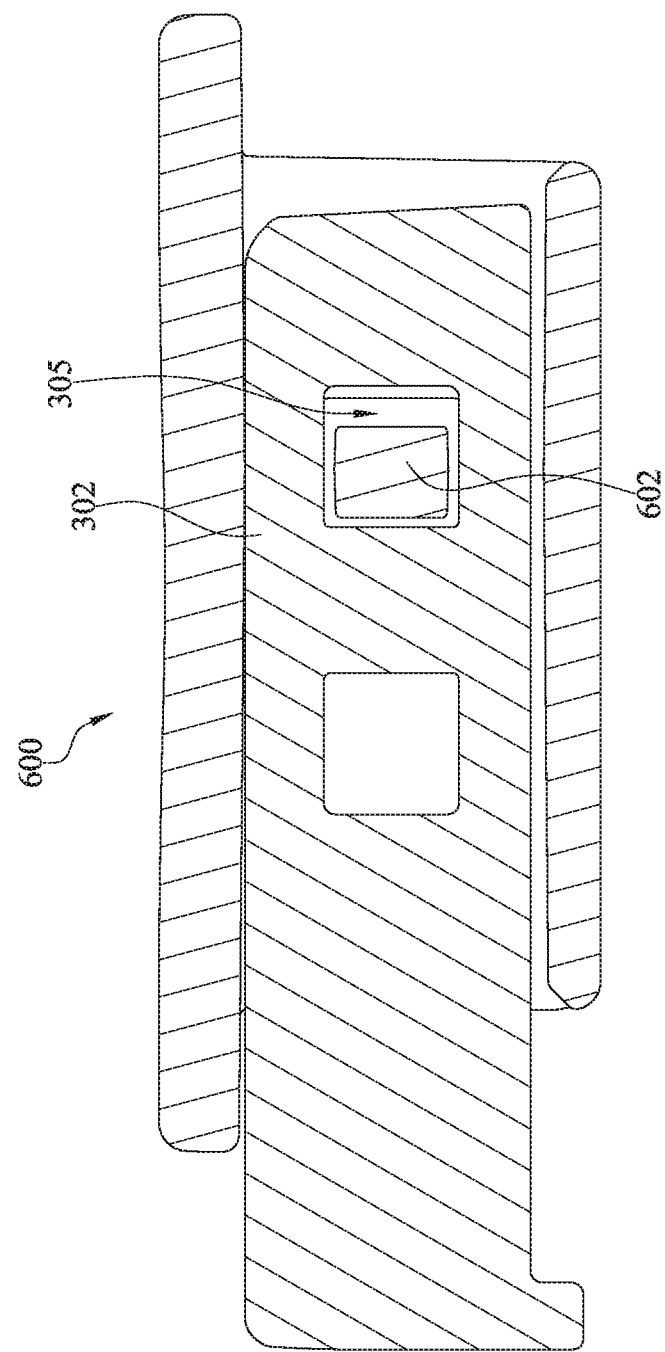
FIG. 10 depicts that the positioning protrusion of the slidable stopper is located in a second positioning hole of the sidewall part.

Moreover, please refer to FIG. 9 and FIG. 10 explain the positioning of the slidable stopper, where FIG. 9 is a side cross-sectional view showing that a positioning protrusion of the slidable stopper is located in a first positioning hole of a sidewall part, and FIG. 10 is a side cross-sectional view showing that the positioning protrusion of the slidable stopper is located in a second positioning hole of the sidewall part. As shown in FIG. 9, when the slidable stopper 600 is in the releasing position, the positioning protrusion 602 of the slidable stopper 600 is located in the first positioning hole 304 of the sidewall part 302 so that the slidable stopper 600 is positioned in the releasing position. As shown in FIG. 10, when the slidable stopper 600 is in the blocking position, the positioning protrusion 602 is located in the second positioning hole 305 of the sidewall part 302 so that the slidable stopper 600 is positioned in the blocking position.

Figure 11:
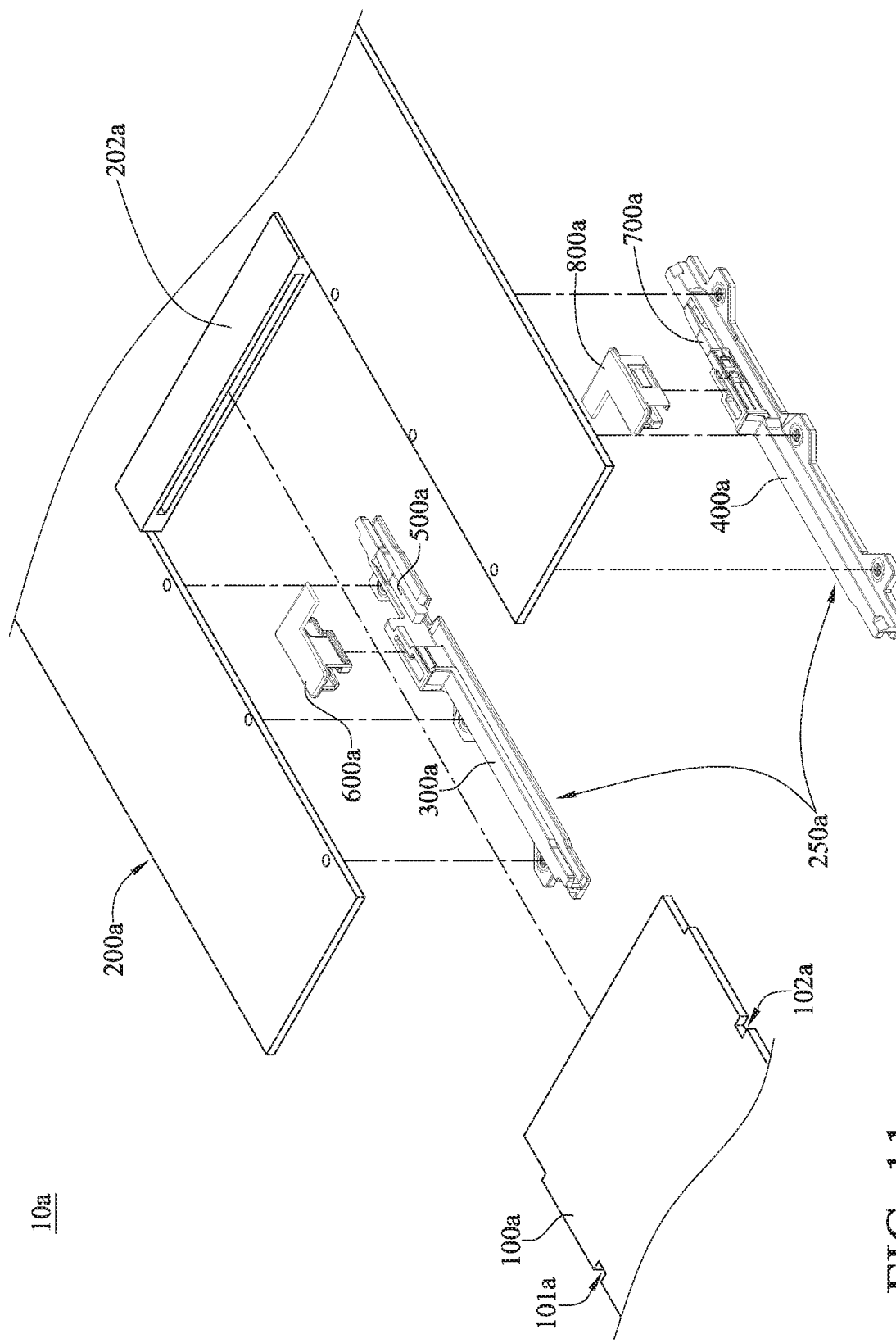
FIG. 11 is an exploded view of a circuit assembly according to a second embodiment of the invention.

The mount structure 250 is not limited to include single latch 500 and single stopper 600, please refer to FIG. 11 that is an exploded view of a circuit assembly according to a second embodiment of the invention.

In this embodiment, the mount assembly 250a of the circuit assembly 10a includes a first slide rail 300a, a second slide rail 400a, a first latch 500a, a first slidable stopper 600a, a second latch 700a and a second slidable stopper 800a. That is, in this embodiment, the mount assembly 250a includes two latches and two slidable stoppers. The first latch 500a and the second latch 700a are respectively disposed on the first slide rail 300a and the second slide rail 400a, and are respectively configured to be engaged into two engagement holes 101a and 102a of the expansion card 100a. The first slidable stopper 600a and the second slidable stopper 800a are respectively disposed on the first slide rail 300a and the second slide rail 400a, and are respectively configured to stop the first latch 500a and the second latch 700a.

The first latch 500a and the second latch 700a have the same or similar configuration to the latch 500 shown in FIGS. 1 to 4 and therefore not repeated in detail here. And the first slidable stopper 600a and the second slidable stopper 800a have the same or similar configuration to the slidable stopper 600 shown in FIGS. 1 to 4 and therefore not repeated in detail here as well.

Also, the installation and removal of the expansion card 100a would be understood referring to the previous paragraphs therefore not repeated in detail here.

According to the mount assembly and the circuit assembly discussed above, the slidable stopper can block the side of the free end part of the cantilever located away from the base part when the slidable stopper is in the blocking position, thus the protrusion protruding from the free end part of the cantilever is prevented from moving away from the expansion card, securing the engagement between the protrusion and the engagement hole. On the other hand, when the slidable stopper is in the released position, the protrusion can be disengaged from the engagement hole by the removal of the expansion card. As such, the cooperation of the latch and the slidable stopper can secure the connection between the expansion card and the socket while allowing the expansion card to be movable along the rails.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A mount assembly, configured to be cooperative with an expansion card and a socket of a circuit board, the mount assembly comprising:
   a first slide rail and a second slide rail, configured to be fixed to the circuit board, wherein the first slide rail and the second slide rail each comprise a base part, a sidewall part, and a groove, the base part and the side wall part together form the groove therebetween, the expansion card is slidable in the grooves of the first slide rail and the second slide rail and is configured to be connected to the socket of the circuit board;
   a first latch, comprising a first cantilever and a first protrusion, wherein the first cantilever comprises a first fixed end part and a first free end part that are located opposite to each other, the first fixed end part is fixed to the sidewall part of the first slide rail, the first protrusion protrudes from the first free end part and is located in the groove of the first slide rail, the first protrusion is configured to be engaged with an engagement hole of the expansion card; and
   a first slidable stopper, comprising a stopper body and a handle portion, wherein the stopper body is slidably disposed on the sidewall part of the first slide rail and movable between a blocking position and a releasing position, and the handle portion protrudes from a side of the stopper body;
   wherein, when the first slidable stopper is in the blocking position and the expansion card is inserted into the socket of the circuit board, the first slidable stopper blocks a side of the first free end part located away from the base part of the first slide rail and the first protrusion so as to prevent the first protrusion from disengaging from the engagement hole of the expansion card;
   when the first slidable stopper is in the releasing position and the expansion card is inserted into the socket of the circuit board, the first slidable stopper is located away from the first free end part to allow the first protrusion to disengage from the engagement hole of the expansion card;
   wherein the sidewall part of the first slide rail comprises a first wall portion, a second wall portion and a third wall portion, the first wall portion is connected to the third wall portion via the second wall portion, the second wall portion is located between the first wall portion and the third wall portion, the first fixed end part is fixed to the third wall portion, and the first slidable stopper is slidably disposed on the second wall portion.

2. The mount assembly according to claim 1, wherein an extension direction of the groove of the first slide rail is substantially parallel to an extension direction of the first cantilever.

3. The mount assembly according to claim 1, wherein the first slidable stopper further comprises a positioning protrusion, the first slide rail further comprises a first positioning hole and a second positioning hole, the first positioning hole and the second positioning hole are located on the sidewall part of the first slide rail, the positioning protrusion protrudes from the stopper body, when the first slidable stopper is located at the releasing position, the positioning protrusion is engaged into the first positioning hole, when the first slidable stopper is located in the blocking position, the positioning protrusion is located in the second positioning hole.

4. The mount assembly according to claim 1, wherein the first protrusion comprises a first guide surface and a second guide surface located on two opposite sides of the first protrusion, and the first guide surface and the second guide surface are configured to be engaged by the expansion card so as to force the first protrusion to be detached from the engagement hole of the expansion card.

5. The mount assembly according to claim 1, wherein the first latch and the first slide rail are integrally formed into a single piece.

6. The mount assembly according to claim 1, further comprising a second latch and a second slidable stopper, wherein the second latch comprising a second cantilever and a second protrusion, the second cantilever comprises a second fixed end part and a second free end part that are located opposite to each other, the second fixed end part is fixed to the sidewall part of the second slide rail, the second protrusion protrudes from the second free end part and is located in the groove of the second slide rail, the second protrusion is configured to be engaged with another engagement hole of the expansion card, the second slidable stopper is slidably disposed on the sidewall part of the second slide rail and movable between a blocking position and a releasing position, when the second slidable stopper is in the blocking position and the expansion card is inserted into the socket of the circuit board, the second slidable stopper blocks a side of the second free end part located away from the base part of the second slide rail and the second protrusion so as to prevent the second protrusion from being detached from the another engagement hole of the expansion card, when the second slidable stopper is in the releasing position and the expansion card is inserted into the socket of the circuit board, the second slidable stopper is located away from the second free end part to allow the second protrusion to disengage from the another engagement hole of the expansion card.

7. A circuit assembly, comprising:
   a circuit board, comprising a plate and a socket disposed on the plate;
   an expansion card, inserted into the socket of the circuit board;
   a first slide rail and a second slide rail, fixed to the circuit board, wherein the first slide rail and the second slide rail each comprise a base part, a sidewall part, and a groove, the base part and the side wall part together form the groove therebetween, the expansion card is slidable in the grooves of the first slide rail and the second slide rail and is configured to be connected to the socket of the circuit board;
   a latch, comprising a cantilever and a protrusion, wherein the cantilever comprises a fixed end part and a free end part that are located opposite to each other, the fixed end part is fixed to the sidewall part of the first slide rail, the protrusion protrudes from the free end part and is located in the groove of the first slide rail, the protrusion is configured to be engaged with an engagement hole of the expansion card; and
   a slidable stopper, comprising a stopper body and a handle portion, wherein the stopper body is slidably disposed on the sidewall part of the first slide rail and movable between a blocking position and a releasing position, the handle portion protrudes from a side of the stopper body;

wherein, when the slidable stopper is in the blocking position and the expansion card is inserted in to the socket of the circuit board, the slidable stopper blocks on a side of the free end part located away from the base part of the first slide rail and the protrusion so as to prevent the protrusion from disengaging from the engagement hole of the expansion card, when the slidable stopper is in the releasing position and the expansion card is inserted into the socket of the circuit board, the slidable stopper is located away from the free end part to allow the protrusion able to disengage from the engagement hole of the expansion card; wherein the sidewall part of the first slide rail comprises a first wall portion, a second wall portion and a third wall portion, the first wall portion is connected to the third wall portion via the second wall portion, the second wall portion is located between the first wall portion and the third wall portion, the fixed end part is fixed to the third wall portion, and the slidable stopper is slidably disposed on the second wall portion.

8. The circuit assembly according to claim 7, wherein the plate of the circuit board comprises a top surface, a bottom surface, an opening, a first wall surface and a second wall surface, the top surface faces away from the bottom surface, the opening penetrates through the top surface and the bottom surface, the first wall surface, the second wall surface and the socket together form the opening, the first wall surface and the second wall surface are connected to the top surface and the bottom surface and face toward each other, the first slide rail and the second slide rail are respectively fixed to the first wall surface and the second wall surface, the socket is located at one side of the opening, and the expansion card is accommodated in the opening.

9. The circuit assembly according to claim 7, wherein an extension direction of the groove of the first slide rail is substantially parallel to an extension direction of the cantilever.

* * * * *